(12) United States Patent
Kim et al.

(10) Patent No.: US 12,713,878 B2
(45) Date of Patent: Aug. 18, 2026

(54) SEMICONDUCTOR MANUFACTURING APPARATUS

(71) Applicant: SAMSUNG ELECTRONICS CO., LTD., Suwon-si (KR)

(72) Inventors: Joohoon Kim, Suwon-si (KR); Dongseop Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 503 days.

(21) Appl. No.: 18/376,862

(22) Filed: Oct. 5, 2023

(65) Prior Publication Data

US 2024/0120234 A1 Apr. 11, 2024

(30) Foreign Application Priority Data

Oct. 7, 2022 (KR) ........................ 10-2022-0129028

(51) Int. Cl.
*H10P 72/76* (2026.01)
*H01J 37/32* (2006.01)
*H10P 72/10* (2026.01)

(52) U.S. Cl.
CPC .... *H10P 72/7612* (2026.01); *H01J 37/32715* (2013.01); *H10P 72/127* (2026.01); *H10P 72/1914* (2026.01)

(58) Field of Classification Search
CPC ............ H01J 37/32715; H10P 72/7612; H10P 72/127; H10P 72/1914; H10P 72/12; H10P 72/50; F16B 4/004; F16B 2200/83
USPC .......................................................... 118/715
See application file for complete search history.

(56) References Cited

U.S. PATENT DOCUMENTS 5,669,977 A 9/1997 Shufflebotham et al.
5,921,773 A 7/1999 Lee
6,317,647 B1 11/2001 Akaike et al.
7,994,793 B2 8/2011 Matsumoto et al.
2018/0073303 A1 3/2018 Bilen et al.
2024/0060182 A1* 2/2024 Lin ..................... C23C 16/4585

FOREIGN PATENT DOCUMENTS

JP 2005-209728 A 8/2005
JP 2006-093315 A 4/2006
JP 2015-050418 A 3/2015
KR 10-0207461 B1 7/1999
KR 10-0461996 B1 4/2005
KR 10-2013-0119563 11/2013
KR 10-2138098 B1 7/2020
KR 10-2021-0054095 A 5/2021

* cited by examiner

*Primary Examiner* — Rodney G Mcdonald
(74) *Attorney, Agent, or Firm* — Muir Patent Law, PLLC

(57) ABSTRACT

A semiconductor manufacturing apparatus includes a first structure having a first hole, a second structure on the first structure, the second structure including a space for accommodating a substrate and a lower plate with a second hole, a first pin insertable into the first hole, the first pin having a same diameter as the first hole and a length smaller than a length of the first hole in a vertical direction, a second pin insertable into the second hole and on the first pin, the second pin having a same diameter as the second hole, a locking plate between the first pin and the second pin, the locking plate overhanging a side wall of the first pin, and a coupling member configured to couple the first pin to or separate the first pin from the second pin.

20 Claims, 9 Drawing Sheets

SEMICONDUCTOR MANUFACTURING APPARATUS

CROSS-REFERENCE TO RELATED APPLICATION

This application is based on and claims priority under 35 U.S.C. § 119 to Korean Patent Application No. 10-2022-0129028, filed on Oct. 7, 2022, in the Korean Intellectual Property Office, the disclosure of which is incorporated by reference herein in its entirety.

BACKGROUND

1. Field

Embodiments relate to a semiconductor manufacturing apparatus, and more particularly, to a semiconductor manufacturing apparatus for improving the yield of semiconductor devices by reducing a process time.

2. Description of the Related Art

In semiconductor manufacturing apparatuses, it is necessary to clean a semiconductor manufacturing apparatus or replace components at regular intervals in order to prevent failure of the semiconductor manufacturing apparatus. In this case, it takes time to clean or replace the components.

SUMMARY

According to an aspect of embodiments, there is provided a semiconductor manufacturing apparatus which includes a first structure having a first hole, a second structure on the first structure, the second structure including a space for accommodating a substrate and a lower plate with a second hole, a first pin insertable into the first hole, the first pin having a same diameter as the first hole and a length smaller than a length of the first hole in a vertical direction, a second pin insertable into the second hole and on the first pin, the second pin having a same diameter as the second hole, a locking plate between the first pin and the second pin, the locking plate overhanging a side wall of the first pin, and a coupling member configured to couple the first pin to or separate the first pin from the second pin.

According to another aspect of embodiments, there is provided a semiconductor manufacturing apparatus which includes a support including a first hole extending in a vertical direction, a boat which is disposed on an upper surface of the support, includes a second hole extending in the vertical direction, and accommodates at least one substrate, a first pin having substantially the same diameter as the first hole, a second pin disposed on the first pin and having substantially the same diameter as the second hole, a locking plate disposed between the first pin and the second pin and overlapping the upper surface of the support in the vertical direction, and a coupling member configured to couple the first pin to or separate the first pin from the second pin, wherein the first pin is inserted into the first hole, and the second pin is inserted into the second hole.

According to yet another aspect of embodiments, there is provided a semiconductor manufacturing apparatus which includes a support including a first hole extending in a vertical direction, a boat which includes a lower plate having a second hole extending in the vertical direction, a rod extending from the lower plate in the vertical direction and having a slot for accommodating a substrate, and an upper plate disposed on the rod and facing the lower plate, a first tube laterally surrounding the boat, a gas supply nozzle extending between a side wall of the first tube and the boat, from the outside of the first tube, a first pin having substantially the same diameter as the first hole, a second pin disposed on the first pin and having substantially the same diameter as the second hole, a locking plate disposed between the first pin and the second pin and overlapping an upper surface of the support in the vertical direction, a coupling member disposed on the second pin and configured to couple the first pin to or separate the first pin from the second pin, and a switch configured to adjust the coupling member to couple the first pin to or separate the first pin from the second pin, wherein the coupling member uses magnetism to couple the first pin to or separate the first pin from the second pin, the second pin, the coupling member, and the switch are integrally coupled to each other, and the switch includes a knob, wherein the first pin is inserted into the first hole, and the second pin is inserted into the second hole.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
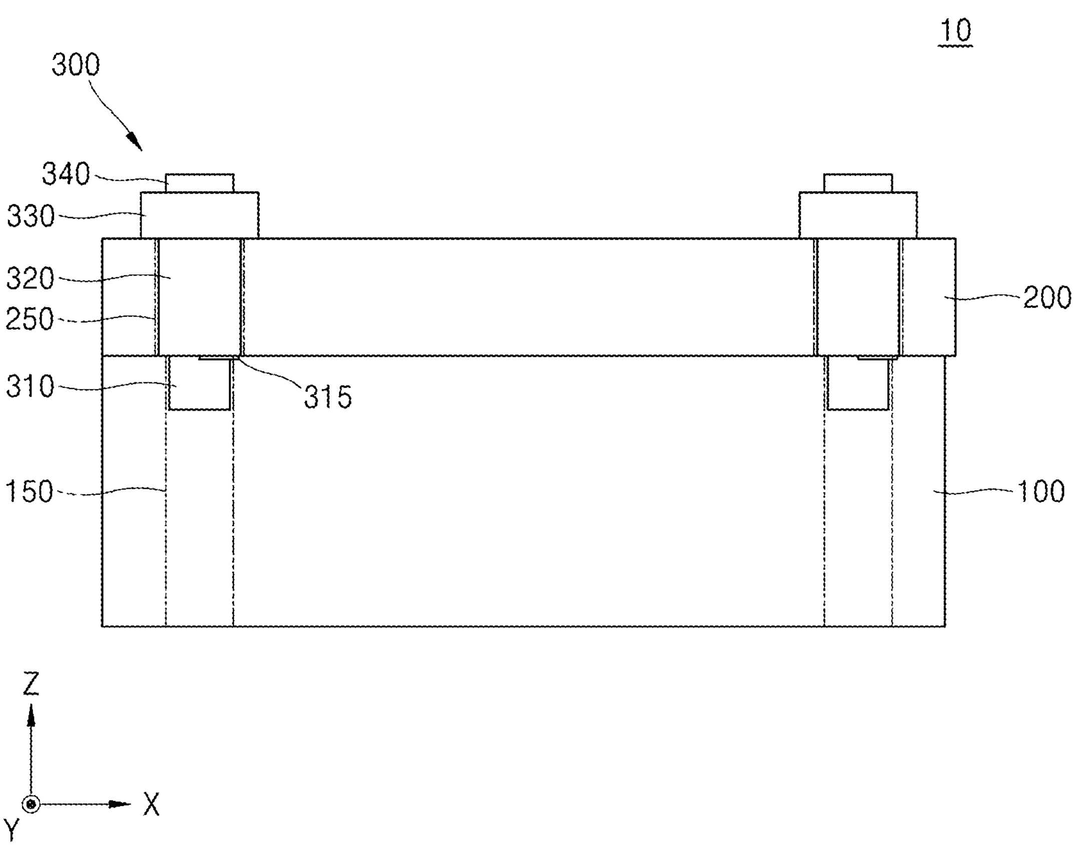
FIG. 1 is a cross-sectional view schematically showing a semiconductor manufacturing apparatus according to embodiments.

Hereinafter, embodiments will be described in detail with reference to the accompanying drawings. The same reference numerals are used for the same elements in the drawings, and redundant description thereof will be omitted.

Figure 2:
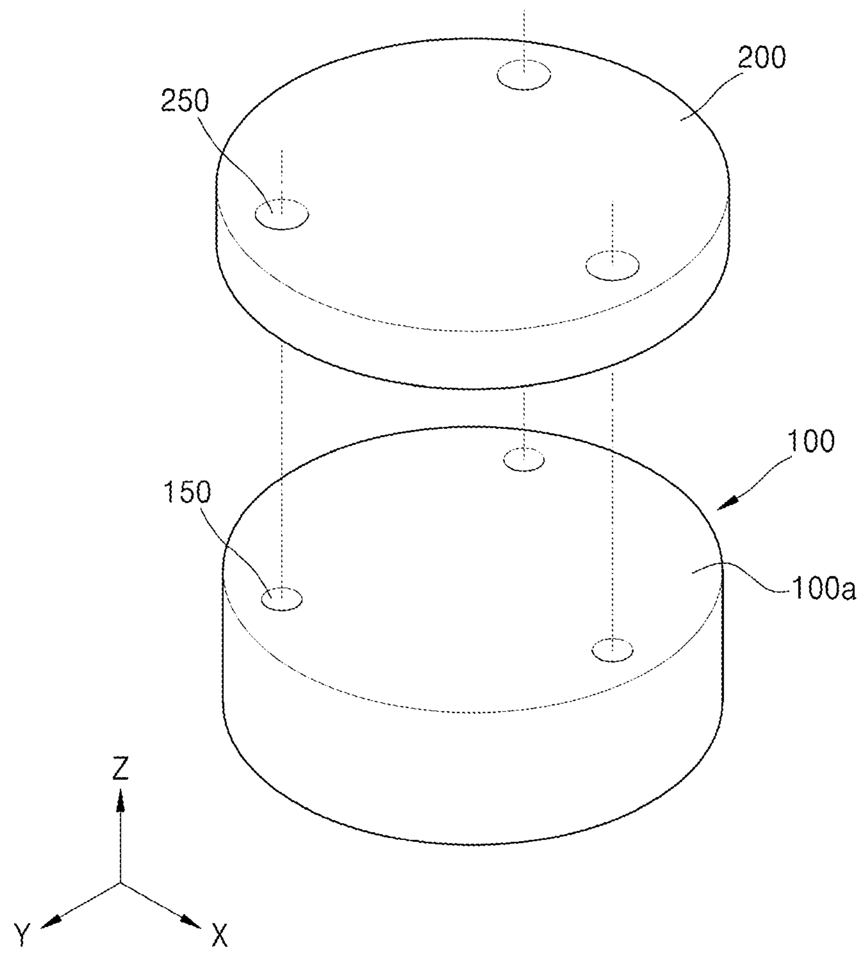
FIG. 2 is a perspective view schematically showing a first structure and a second structure of a semiconductor manufacturing apparatus according to embodiments.
Figure 3:
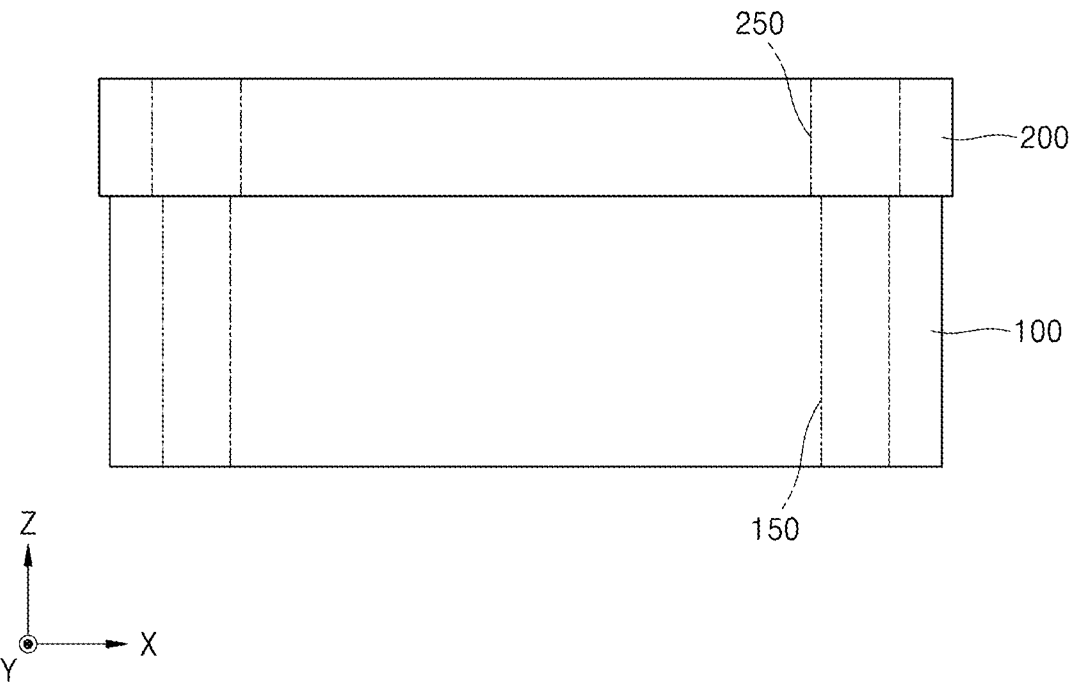
FIG. 3 is a cross-sectional view schematically showing a first structure and a second structure of a semiconductor manufacturing apparatus according to embodiments.
Figure 4:
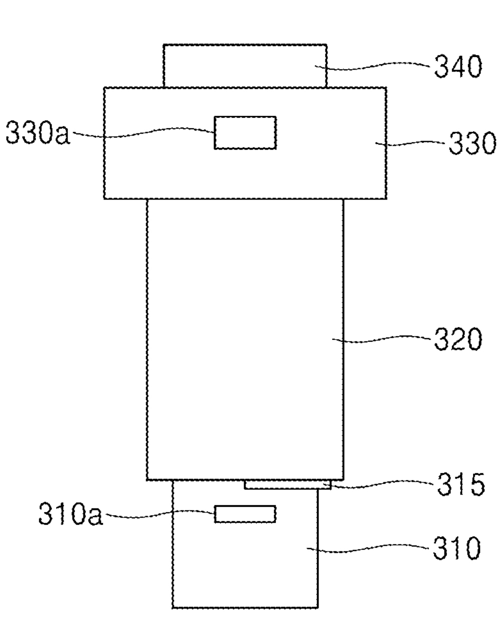
FIG. 4 is a front view schematically showing an alignment memory device of a semiconductor manufacturing apparatus according to embodiments.
Figure 4:
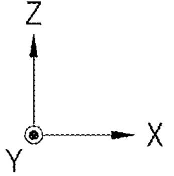
Figure 5:
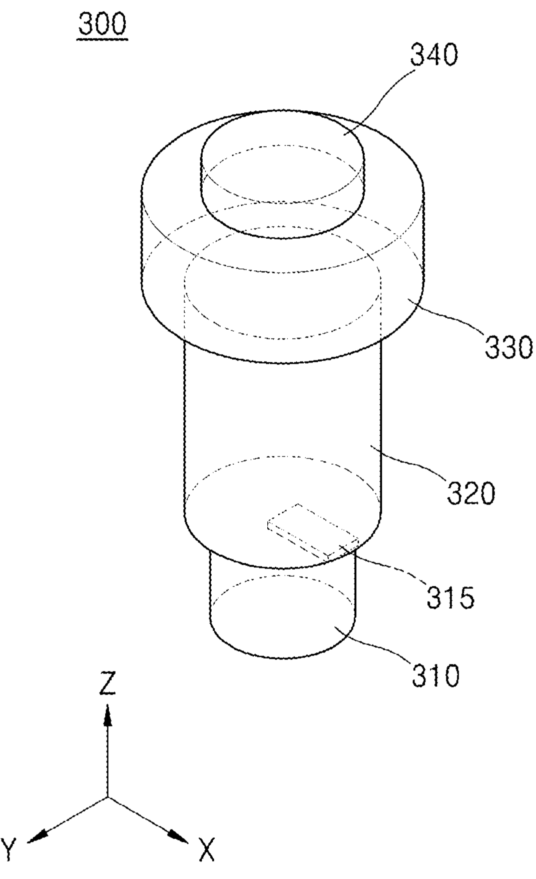
FIG. 5 is a perspective view schematically showing an alignment memory device of a semiconductor manufacturing apparatus according to embodiments.

FIG. 1 is a cross-sectional view schematically showing a semiconductor manufacturing apparatus according to embodiments. FIG. 2 is a perspective view schematically showing a first structure and a second structure of the semiconductor manufacturing apparatus according to embodiments. FIG. 3 is a cross-sectional view schematically showing the first structure and the second structure of the semiconductor manufacturing apparatus according to embodiments. FIG. 4 is a front view schematically showing an alignment memory device of the semiconductor manufacturing apparatus according to embodiments. FIG. 5 is a perspective view schematically showing the alignment memory device of the semiconductor manufacturing apparatus according to embodiments.

Referring to FIGS. 1 to 5, a semiconductor manufacturing apparatus 10 may include a first structure 100, a second structure 200, and an alignment memory device 300.

The first structure 100 may be disposed below the second structure 200. In the following drawings, an X-axis direction and an Y-axis direction may represent directions parallel to the upper or lower surface of the first structure 100, and the X-axis direction and the Y-axis direction may be perpendicular to each other. A Z-axis direction may represent a direction perpendicular to the upper or lower surface of the first structure 100. In other words, the Z-axis direction may be a direction perpendicular to the X-Y plane.

Also, in the following drawings, a first horizontal direction, a second horizontal direction, and a vertical direction may be understood as follows. The first horizontal direction may be understood as the X-axis direction, the second horizontal direction may be understood as the Y-axis direction, and the vertical direction may be understood as the Z-axis direction.

The first structure 100 may have a, e.g., cylindrical, shape extending in the vertical direction, i.e., the Z-axis direction. The first structure 100 may have a shape extending in the vertical direction while having a, e.g., circular, cross-section in the X-Y plane.

The first structure 100 may have a first hole 150 extending in the vertical direction. For example, the first hole 150 may have a shape extending in the vertical direction from the upper surface to the lower surface of the first structure 100, e.g., along an entire thickness of the first structure 100 in the vertical direction. In another example, the first hole 150 may include a recess that is formed in a direction oriented from the upper surface to the lower surface of the first structure 100, e.g., the first hole 150 may be a hole that is formed on the upper surface of the first structure 100 and extends only partially toward the lower surface (i.e., does not extend through an entire thickness of the first structure 100 to the lower surface).

The second structure 200 may be disposed on the upper surface of the first structure 100. According to embodiments, the second structure 200 may be stacked on the first structure 100.

The second structure 200 may have a second hole 250 extending in the vertical direction, i.e., in the Z-axis direction. For example, the second hole 250 may have a shape extending in the vertical direction Z from the upper surface to the lower surface of the second structure 200, e.g., along an entire thickness of the first structure 100 in the vertical direction. In another example, the second hole 250 may include a recess that is formed in a direction from the upper surface to the lower surface of the second structure 200, e.g., the second hole 250 may be a hole that is formed on the upper surface of the second structure 200 and extends only partially toward the lower surface.

In some embodiments, the second structure 200 may include a space for accommodating a substrate, a lower plate facing the first structure 100, an upper plate facing the lower plate, and a rod connecting the upper plate to the lower plate. In this case, the second hole 250 may be formed in the lower plate. The second structure 200 including the lower plate, the upper plate, and the rod will be described in detail with reference to FIGS. 7 to 9.

The first hole 150 may overlap the second hole 250 in the vertical direction. In other words, the first hole 150 and the second hole 250 may be positioned to face each other in the vertical direction. For example, a horizontal cross-section of each of the first hole 150 and the second hole 250 may be a concentric circle, e.g., the first and second holes 150 and 250 may be aligned and concentric with each other (FIG. 3). In another example, central axes of the first hole 150 and the second hole 250 in the vertical direction (i.e., the Z-axis direction) may be spaced apart from each other in a horizontal direction (i.e., in the X or Y axis direction). That is, the horizontal cross-sections of the first hole 150 and the second hole 250 may not have a concentric circle.

For example, as illustrated n FIG. 3, the horizontal cross-section of the first hole 150 may be smaller than the horizontal cross-section of the second hole 250. That is, the area of the cross-section of the first hole 150 on the X-Y plane may be smaller than the area of the cross-section of the second hole 250 on the X-Y plane. In another example, the horizontal cross-sectional area of the first hole 150 may be greater than or substantially the same as the horizontal cross-sectional area of the second hole 250.

Referring to FIGS. 1, 4, and 5, the alignment memory device 300 of the semiconductor manufacturing apparatus 10 may include a first pin 310, a second pin 320, a locking plate 315, a coupling member 330, and a switch 340.

The first pin 310 may have a shape extending in the vertical direction (i.e., in the Z-axis direction). The first pin 310 may have substantially the same cross-sectional area as the first hole 150, e.g., the first pin 310 may have substantially the same diameter as the first hole 150. That is, the first pin 310 may be fitted into the first hole 150 (e.g., the first hole 150 is indicated by a dashed line in FIG. 1). The cross-sectional area may be understood as a cross-sectional area on the X-Y plane (e.g., as viewed in a top view). For example, when the first hole 150 has a cylindrical shape extending in the vertical direction, the first pin 310 may extend in the vertical direction and have a substantially same diameter as the first hole 150. In addition, when the first hole 150 has a prismatic shape extending in the vertical direction, the first pin 310 may have a shape extending in the vertical direction while having a substantially same shape and cross-sectional area on the X-Y plane as the first hole 150. Since the first pin 310 and the first hole 150 have substantially the same shape and cross-sectional area, e.g., dimensions, the first pin 310 may be inserted, e.g., insertable, into the first hole 150.

For example, as illustrated in FIG. 1, the length of the first pin 310 in the vertical direction may be less than the length of the first hole 150 in the vertical direction. In another example, the length of the first pin 310 in the vertical direction may be substantially the same as the length of the first hole 150 in the vertical direction.

The locking plate 315 may be disposed between the first pin 310 and the second pin 320. The locking plate 315 may be integrally coupled with the first pin 310. For example, the locking plate 315 may be integrally formed on the upper surface of the first pin 310 through soldering, e.g., the locking plate 315 and the upper surface of the first pin 310 may be integrated into a single and inseparable structure through soldering. For example, as illustrated in FIG. 4, only a portion of the locking plate 315 may be coupled to the upper surface of the first pin 310, while a remainder of the locking plate 315 may overhang the first pin 310, e.g., extend beyond an outer sidewall of the first pin 310.

For example, the locking plate 315 may have a rectangular cross-section on the X-Y plane, e.g., in a top view. In another example, the locking plate 315 may have any suitable shape, e.g., a polygonal or circular shape.

The first pin 310 may include a magnetic body 310*a*. According to embodiments, the first pin 310 may include a magnetic body 310 therein, e.g., within its interior. In this case, the magnetic body 310*a* may be located near the upper surface of the first pin 310, e.g., the magnetic body 310*a* may be located near a surface of the first pin 310 facing the second pin 320. According to embodiments, the first pin 310 may include metal. For example, the first pin 310 may include steel use stainless (SUS), e.g., SUS410 and/or SUS410L having magnetism.

The locking plate 315 may overlap the upper surfaces of the first pin 310 and the first structure 100 in the vertical direction. The upper surface 100*a* of the first structure 100 may represent a surface except for the first hole 150 formed in the first structure 100, as illustrated in FIG. 2. That is, the locking plate 315 may be disposed over the upper surface of the first pin 310 and the upper surface 100*a* of the first structure 100, e.g., the locking plate 315 may partially overlap each of the upper surface of the first pin 310 and the upper surface 100*a* of the first structure 100 due to the remainder of the locking plate 315 overhanging the first pin 310. Accordingly, the first pin 310 may be disposed such that the upper surface of the first pin 310 is positioned on the same plane as the upper surface of the first structure 100 by the locking plate 315, e.g., the remainder of the locking plate 315 overhanging the first pin 310 and overlapping the upper surface 100*a* of the first structure 100 may maintain the first pin 310 in the upper portion for the first hole 150 to have the upper surfaces of the first pin 310 and the first structure 100 coplanar with each other. In other words, the first pin 310 may be inserted into the first hole 150 without falling into, e.g., through, the first hole 150 by the locking plate 315, while the upper surface of the first pin 310 maintains the same level in the vertical direction as the upper surface of the first structure 100.

The locking plate 315 may be positioned within a footprint of the second pin 320, e.g., the locking plate 315 may be completely overlapped by a bottom of the second pin 320. If the locking plate 315 were to be formed, e.g., extended, beyond the footprint of the second pin 320, the first pin 310 could not have passed through the second hole 250 and could not have been inserted into the first hole 150. That is, when the first pin 310 is integrally coupled with the locking plate 315, if the locking plate were to extend beyond the footprint of the second pin 320, the first pin 310 could not have passed through the second hole 250 (e.g., when inserted through the top of the second hole 250 in order to be inserted into the first hole 150), and thus, could not have been inserted into the first hole 150.

According to embodiments, the thickness of the locking plate 315 in the vertical direction may be in a range from about 0.8 mm to about 1.2 mm. The thickness of the locking plate 315 may be less than a gap between the first structure 100 and the second structure 200 in the vertical direction.

The second pin 320 may be disposed on the first pin 310. The second pin 320 may have a shape extending in the vertical direction. The second pin 320 may have substantially the same cross-sectional area, e.g., dimensions, as the second hole 250. The cross-sectional area may be understood as a cross-sectional area on the X-Y plane. For example, when the second hole 250 has a cylindrical shape extending in the vertical direction, the second pin 320 may extend in the vertical direction and have substantially the same diameter as the second hole 250. In addition, when the second hole 250 has a prismatic shape extending in the vertical direction, the second pin 320 may have a shape extending in the vertical direction while having substantially the same shape and area on the X-Y plane as the second hole 250. Since the second pin 320 and the second hole 250 have substantially the same shape and area, the second pin 320 may be inserted into the second hole 250. According to embodiments, the length of the second pin 320 in the vertical direction may be substantially the same as the length of the second hole 250 (e.g., indicated by a dashed line in FIG. 1) in the vertical direction.

The coupling member 330 (e.g., a coupler) may be configured to couple the first pin 310 to the second pin 320 in the vertical direction and/or separate the first pin 310 from the second pin 320. According to embodiments, the coupling member 330 may be positioned on the upper surface of the second pin 320 and couple the first pin 310 to or separate the first pin 310 from the second pin 320 in the vertical direction. For example, as illustrated in FIG. 5, the coupling member 330 may be on a surface of the second pin 320 facing away from the first pin 310, so the second pin 320 may be between the first pin 310 and the coupling member 330.

In some embodiments, the coupling member 330 may use magnetism to couple the first pin 310 to or separate the first pin 310 from the second pin 320. For example, the coupling member 330 may be integrally coupled with the upper surface of the second pin 320, e.g., the coupling member 330 and the second pin 320 may be integrated into a single and inseparable structure, and may include a magnet 330*a* having different poles therein. In this case, the coupling member 330 may couple the first pin 310 to or separate the first pin 310 from the second pin 320 while changing a direction of the poles, e.g., the coupling member 330 may couple the first pin 310 to the second pin 320 via the magnetic force between magnet 330*a* of the coupling member 330 and the magnetic body 310*a* of the first ping with the locking plate 315 between the first and second pins 310 and 320.

In order for the first pin 310 to be coupled to or separated from the second pin 320 according to the direction of the poles of the magnet in the coupling member 330, the first pin 310 may include the magnetic body. Since the second pin 320 is integrally coupled with the coupling member 330, the second pin 320 may not include a magnetic body.

For example, as illustrated in FIG. 5, the switch 340 may be positioned on the upper surface coupling member 330. In another example, the switch 340 may be positioned on the side surface of the coupling member 330. The switch 340 may be integrally coupled with the second pin 320 and the coupling member 330.

The switch 340 may be configured to switch the coupling member 330 between the on-state and the off-state. The on-state is defined as a state, in which the coupling member 330 couples the first pin 310 to the second pin 320 in the vertical direction. The off-state is defined as a state, in which the coupling member 330 separates the first pin 310 from the second pin 320. That is, the switch 340 may adjust the coupling member 330 to couple the first pin 310 to or separate the first pin 310 from the second pin 320.

For example, the switch 340 may physically rotate to switch the coupling member 330 between the on-state and the off-state. In other words, the switch 340 may rotate, e.g., be rotatable, to adjust the state of the coupling member 330.

Figure 6:
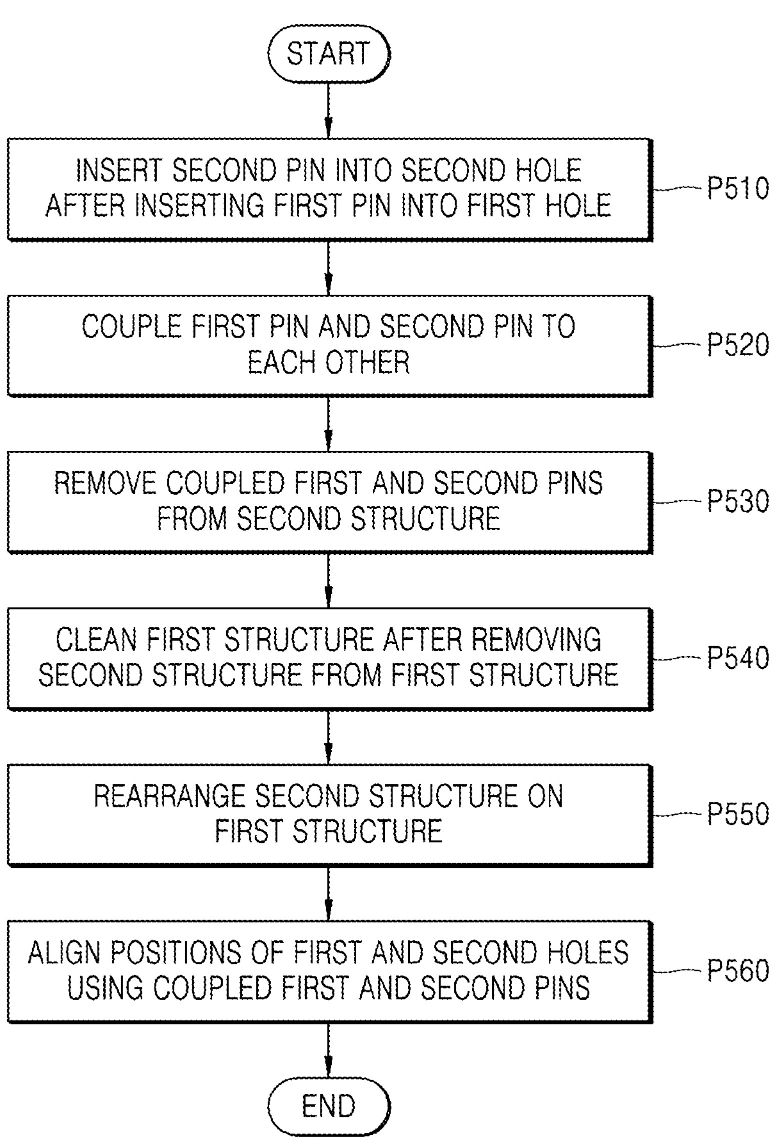
FIG. 6 is a flowchart for describing a semiconductor manufacturing method according to an embodiment.

FIG. 6 is a flowchart for describing a semiconductor manufacturing method according to an embodiment.

Referring to FIGS. 1 and 6, the semiconductor manufacturing method may include a first operation (P510) of inserting the second pin 320 into the second hole 250 after inserting the first pin 310 into the first hole 150 in order to save alignment positions of the first structure 100 and the second structure 200, a second operation (P520) of coupling the first pin 310 and the second pin 320 to each other, a third operation (P530) of separating the coupled first and second pins 310 and 320 from the second structure 200, a fourth operation (P540) of cleaning the first structure 100 after separating the second structure 200 from the first structure 100, a fifth operation (P550) of rearranging the second structure 200 on the first structure 100, and a sixth operation (P560) of aligning the positions of the first hole 150 and the second hole 250 by using the coupled first and second pins 310 and 320.

First, referring to the first operation (P510), the first pin 310 may be inserted into the first hole 150 formed in the first structure 100. For example, when the first and second structures 100 and 200 are on top of each other and the first and second holes 150 and 250 are aligned, the first pin 310 may be inserted from the top of the combined structure of the first and second structures 100 and 200, e.g., through the top of the second hole 250. The first pin 310 may pass through the second hole 250 of the second structure 200 and be inserted into the first hole 150. In this case, the first pin 310 may be positioned without falling into the first hole 150 by the locking plate 315 coupled to the first pin 310, so that an upper surface of the first pin 310 has the same plane as an upper surface of the first hole 150. That is, as described previously, the structure of the locking plate 315 on the upper surface of the first pin 310 allows the first pin 310 to pass through the second hole 250 and be suspended in the top portion of the first hole 150 by the locking plate 315 (which overhangs the first pin 310 to overlap the upper surface 100*a* of the first structure 100).

Subsequently, the second pin 320 is inserted into the second hole 250. Since the second pin 320 has substantially the same length in the vertical direction as the second hole 250, the second pin 320 may be inserted into the second hole 250 while being in contact with the upper surface of the first pin 310.

The shape and cross-sectional area of the first pin 310 on the X-Y plane are substantially the same as the shape and cross-sectional area, e.g., width, of the first hole 150 on the X-Y plane, and the shape and cross-sectional area of the second pin 320 on the X-Y plane are substantially the same as the shape and cross-sectional area, e.g., width, of the second hole 250 on the X-Y plane. Accordingly, the first pin 310 and the second pin 320 may be inserted into the first hole 150 and the second hole 250, respectively, without tolerance.

Then, referring to the second operation (P520), the first pin 310 and the second pin 320 are coupled to each other so as to be adjacent to each other in the vertical direction Z. In this case, the first pin 310 and the second pin 320 may be coupled to each other by the coupling member 330. For example, the coupling member 330 may couple the first pin 310 to the second pin 320 by using magnetism, e.g., via operation of the switch 340. In another example, the coupling member 330 may couple the first pin 310 to the second pin 320 in the vertical direction by using a hook, viscosity, or the like.

The horizontal cross-sections of the first hole 150 and the second hole 250 may not have a concentric circle, and in this case, the horizontal cross-sections of the first pin 310 and the second pin 320 also do not have a concentric circle. Accordingly, the first pin 310 and the second pin 320 may be coupled to each other in the vertical direction Z in a state in which the horizontal cross-sections thereof do not have a concentric circle.

As the first pin 310 and the second pin 320 are coupled to each other, relative positions of the first hole 150 of the first structure 100 and the second hole 250 of the second structure 200 may be saved. That is, the coupled first pin 310 and second pin 320 may indicate the current positions of the first hole 150 and the second hole 250, respectively.

The first pin 310 and the second pin 320 may indicate the current positions of the first hole 150 and the second hole 250, respectively, and the first hole 150 and the second hole 250 may be present at fixed positions of the first structure 100 and the second structure 200, respectively. Accordingly, the first pin 310 and the second pin 320 may indicate the current relative positions of the first structure 100 and the second structure 200.

The number of first pins 310 and second pins 320 may correspond to the number of first holes 150 and second holes 250. That is, when the number of each of the first holes 150 and the second holes 250 is three, three first pins 310 and three second pins 320 may be provided.

Referring to the third operation (P530), the coupled first pin 310 and second pin 320 are separated from the second structure 200. For example, the second structure 200 may be removed.

In this case, the coupled first pin 310 and the second pin 320 may be understood as one alignment memory device 300. When a plurality of alignment memory devices 300 are provided during the second operation (P520), all of the plurality of alignment memory devices 300 are separated from the second structure 200 in the third operation (P530).

When relative positions of the first structure 100 and the second structure 200 are changed after the alignment memory device 300 is separated from the second structure 200, the alignment memory device 300 may not be inserted into the first hole 150 and the second hole 250. For example, when the second structure 200 is rotated about a direction in which the vertical direction is an outer product vector in a state in which the first structure 100 is fixed, the relative positions of the first hole 150 and the second hole 250 are changed. Therefore, the alignment memory device 300 may not be inserted into both the first hole 150 and the second hole 250.

In addition, when the second structure 200 moves in a horizontal direction (e.g., the X-axis direction or the Y-axis direction) in a state in which the first structure 100 is fixed, the relative positions of the first hole 150 and the second hole 250 are also changed. Therefore, the alignment memory device 300 may not be inserted into both the first hole 150 and the second hole 250.

Referring to the fourth operation (P540), after the alignment memory device 300 is separated from the second structure 200 and the second structure 200 is separated from the first structure 100 (P530), the second structure 200 may be removed for cleaning or repair.

In detail, the second structure 200 may be separated from the first structure 100 in a state in which the first structure 100 is fixed, e.g., the alignment memory device 300 (e.g., the second pin 320 coupled to the first pin 310) may protrude from the first hole 150 of the first structure 100 when the second structure 200 is removed. Subsequently, a treatment for the second structure 200 may be performed. According to embodiments, preventive maintenance (PM) may be performed on the separated second structure 200. During the PM, the second structure 200 may be replaced or cleaned.

Referring to the fifth operation (P550), the separated second structure 200 is rearranged on, e.g., above, the first structure 100, e.g., after treatment, repair, or cleaning. The treated second structure 200 may be rearranged on the first structure 100, so a semiconductor manufacturing process may be performed.

In this case, if the rearranged second structure 200 were to be disposed on the fixed first structure 100 differently from its position before the separation, scattering of various parameters could have occurred during a subsequent semiconductor manufacturing process, e.g., parameters could have changed and affected the resultant products and yield. Also, time required for inspection and realignment would have increased, thereby increasing overall manufacturing time and costs.

Referring to the sixth operation (P560), the rearranged second structure 200 may be positioned at the same position as before separation by using the coupled first pin 310 and second pin 320. In other words, the second structure 200 after treatment may be located at the same position as the position of the second structure 200 before treatment, by aligning the alignment memory device 300, e.g., the alignment memory device 300 protruding from the first hole 150 of the first structure 100.

First, the second structure 200 is located, e.g., positioned, such that the second hole 250 thereof overlaps the first hole 150 of the first structure 100. Subsequently, the arrangement of the second structure 200 may be adjusted so that the alignment memory device 300 is inserted through both the first hole 150 and the second hole 250.

When one alignment memory device 300 is inserted into one of first holes 150 and one of second holes 250, another alignment memory device 300 is inserted into another first hole 150 and another second hole 250 in the same way. In this way, when all of the two or more alignment memory devices 300 are inserted, the rearranged second structure 200 may be located at the same position as the position of the second structure 200 before separation.

That is, when the second structure 200 is rearranged in the semiconductor manufacturing apparatus 10 according to embodiments, the second structure 200 may be located at substantially the same position as the previous position thereof by the alignment memory device 300.

Also, the first pin 310 and the second pin 320 are coupled to each other by the coupling member 330 after the first pin 310 and the second pin 320 are individually inserted into the first hole 150 and the second hole 250, respectively. Therefore, the alignment memory device 300 may save, e.g., maintain, the relative positions of the first hole 150 and the second hole 250 regardless of the previous relative positions of the first hole 150 and the second hole 250. That is, regarding a plurality of first holes 150 and second holes 250, when a first hole 150 and a second hole 250 facing each other are referred to as one set, a plurality of sets may be provided. In this case, even when the relative position of the first hole 150 and the second hole 250 of each set is different from each set, the separated first pin 310 and second pin 320 are inserted into the first hole 150 and the second hole 250, respectively, and then coupled to each other later, the relative positions of the first hole 150 and the second hole 250 of each of the plurality of sets may be saved.

Figure 7:
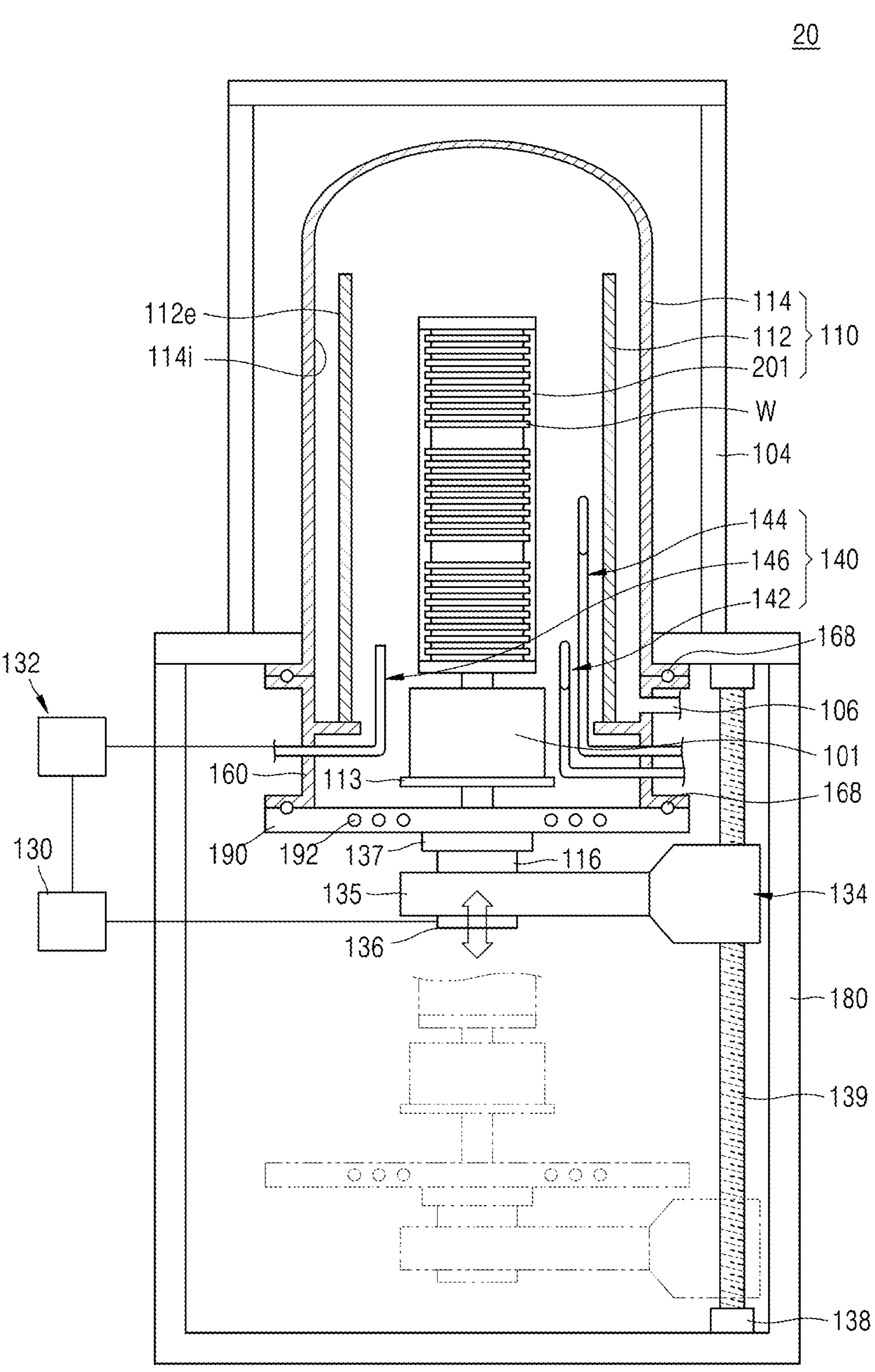
FIG. 7 is a schematic view showing batch equipment according to an embodiment.
Figure 8:
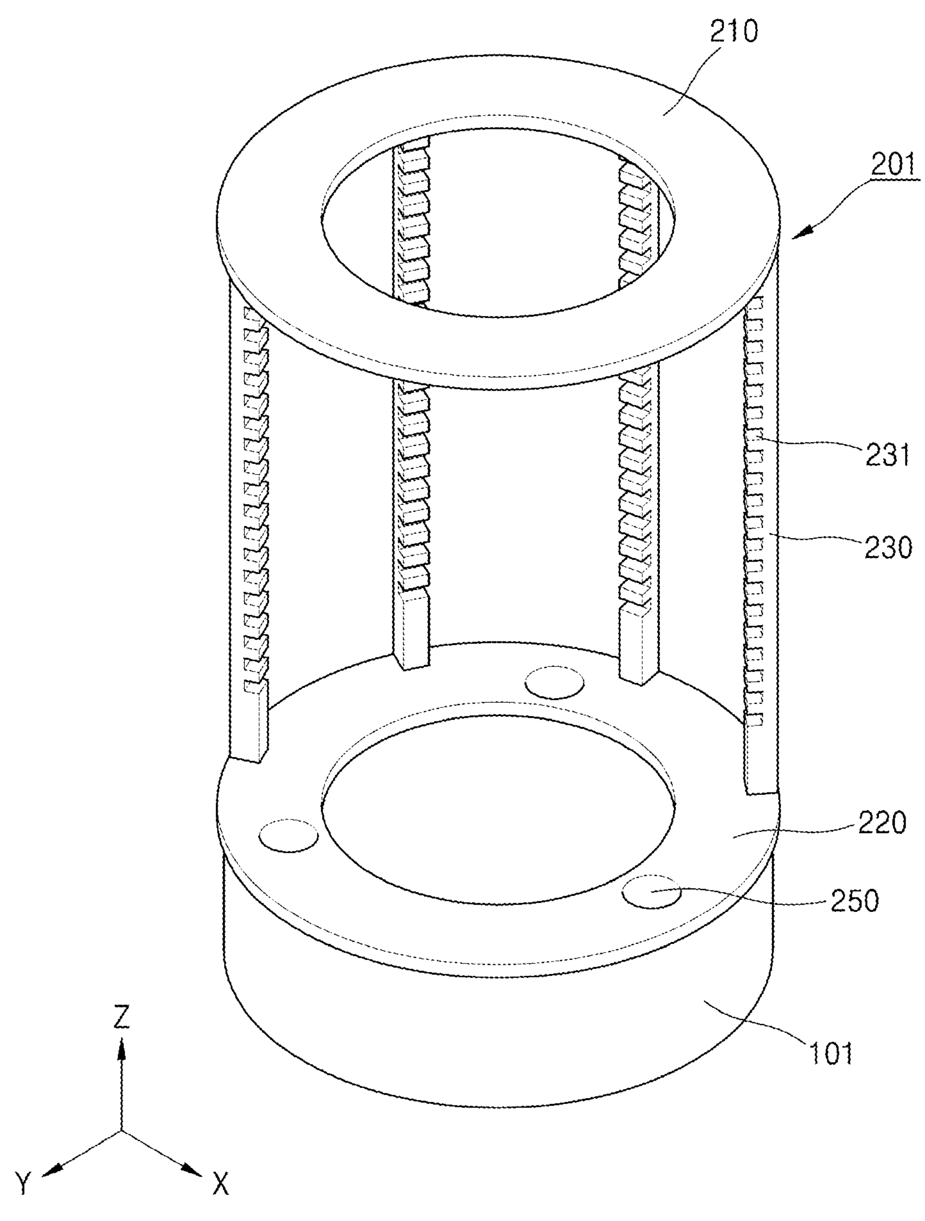
FIG. 8 is a perspective view schematically showing a first structure and a second structure of a semiconductor manufacturing apparatus according to an embodiment.
Figure 9:
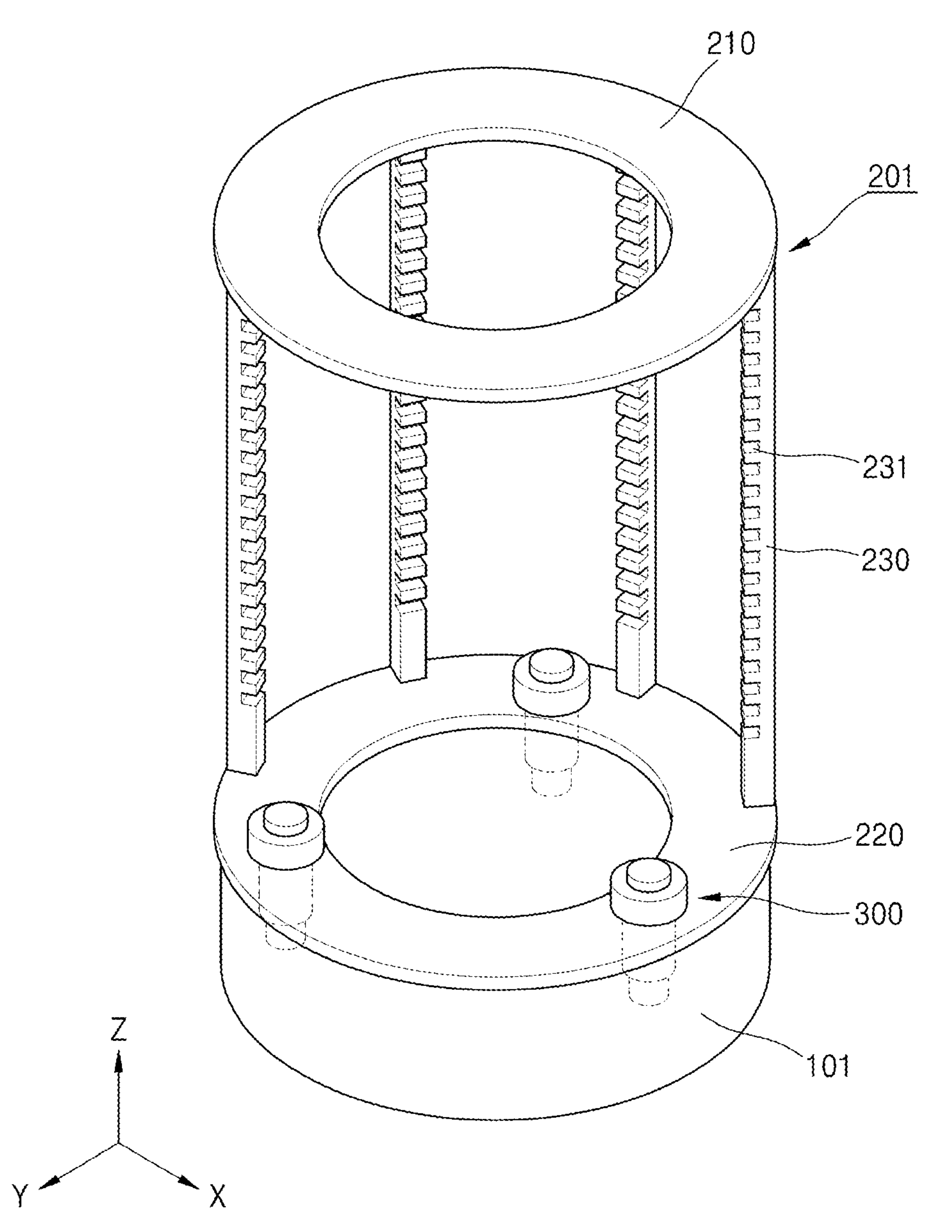
FIG. 9 is a perspective view schematically showing a semiconductor manufacturing apparatus according to an embodiment.

FIG. 7 is a schematic view showing batch equipment according to an embodiment. FIG. 8 is a perspective view schematically showing a first structure and a second structure of a semiconductor manufacturing apparatus according to an embodiment. FIG. 9 is a perspective view schematically showing the semiconductor manufacturing apparatus according to an embodiment. Hereinafter, descriptions of elements described previously with reference to FIGS. 1 to 6 will be omitted.

Referring to FIGS. 7 to 9, a semiconductor manufacturing apparatus 20 may include a process chamber 110, a heating unit 104 surrounding the process chamber 110, and a nozzle unit 140.

The process chamber 110 may include a first tube 112, a second tube 114, and a boat 201.

The first tube 112 extends, e.g., in a vertical direction, and has a cylindrical shape with open upper and lower ends or with a closed upper end, and may accommodate the boat 201 therein. The boat 201 may be loaded with a plurality of substrates W. The first tube 112 may include a material that can withstand high temperatures, e.g., quartz or silicon carbide (SiC).

The second tube 114 extends, e.g., in a vertical direction. An upper portion of the second tube 114 may have a dome shape, and a lower portion thereof may have an open cylinder shape. The second tube 114 may laterally surround the first tube 112. Accordingly, the inner diameter of the second tube 114 may be greater than the outer diameter of the first tube 112. In addition, an outer surface 112*e* of the first tube 112 and an inner surface 114*i* of the second tube 114 may be spaced apart from each other. The second tube 114 may include a material that can withstand high temperatures, e.g., quartz or silicon carbide (SiC).

The heating unit 104 for heating the process chamber 110 may be provided outside the process chamber 110 in a lateral direction. The heating unit 104 may laterally surround the process chamber 110. In some embodiments, the heating unit 104 may be configured to cover an upper portion of the process chamber 110.

A manifold 160 may be provided below the process chamber 110. The manifold 160 may be coupled to a lower portion of the process chamber 110. Specifically, the manifold 160 may be located concentrically with the second tube 114 below the second tube 114. The manifold 160 may have a cylindrical shape with open upper and lower ends and may include metal, e.g., steel.

One side of the manifold 160 may be provided with an exhaust unit 106 through which surplus source gases, purge gases, and reaction by-products are discharged. The exhaust unit 106 may be connected to a vacuum pump for evacuating the process chamber 110.

The boat 201 may include a lower plate 220, an upper plate 210, rods 230, and slots 231. The lower plate 220 has a plate shape and may be positioned on the upper surface of a support 101. The upper plate 210 may face the lower plate 220 and be spaced apart from the lower plate 220 in the vertical direction (e.g., the Z-axis direction). Each of the rods 230 serves as a column connecting the lower plate 220 to the upper plate 210 and may have a shape extending in the vertical direction. The rod 230 may include the slots 231 for accommodating substrates, e.g., wafers. According to embodiments, the slots 231 may be arranged at regular intervals on the inner surface of the rod 230. A substrate may be placed in each slot 231 and contact the rod 230 in a lateral direction.

The lower plate 220 may include the second holes 250. Each of the second holes 250 may have a shape extending in the vertical direction from the upper surface to the lower surface of the lower plate 220.

According to embodiments, the boat 201 may correspond to the second structure 200 described with reference to FIGS. 1 to 6, and the second hole 250 formed in the lower plate 220 may correspond to the second hole 250 described with reference to FIGS. 1 to 6. Accordingly, the second pin 320 of the alignment memory device 300 may be inserted into the second hole 250 of the lower plate 220.

The boat 201 may accommodate a plurality of the substrates W in the vertical direction at certain intervals. The boat 201 may be carried into or out of the process chamber 110 by a vertical driving unit 134. After the substrates W are accommodated in the boat 201 and loaded into the process chamber 110, a lower opening of the manifold 160 may be closed by a lid member 190. The inner space of the manifold 160 may have a relatively lower temperature than the inner space of the process chamber 110. A heater 192 may be provided in the lid member 190 to compensate for this temperature difference. That is, the heater 192 heats the inside of the manifold 160, and thus, the temperature distribution inside the process chamber 110 and the inside of the manifold 160 may be uniform. For example, an electric resistance heating wire may be used as the heater 192.

The support 101 may be disposed below the boat 201. The support 101 may include a cylindrical body and a column directly contacting the boat 201 in the vertical direction. The support 101 may have the first holes 150, and each of the first holes 150 may be formed in the body or column. The first hole 150 may have a shape extending in the vertical direction. According to embodiments, the support 101 may correspond to the first structure 100 described with reference to FIGS. 1 to 6, and the first hole 150 formed in the body or column may correspond to the first hole 150 described with reference to FIGS. 1 to 6. Therefore, the first pin 310 of the alignment memory device 300 may be inserted into the support 101, i.e., into the first hole 150 formed in the body or column.

As illustrated in FIG. 9, the alignment memory device 300 may be inserted into the second hole 250 formed in the lower plate 220 of the boat 201 and the first hole 150 formed in the support 101. Accordingly, the relative positions of the support 101 and the boat 201 may be saved, e.g., set, by the alignment memory device 300 in the same manner as described with reference to FIGS. 1 to 6.

Seal members 168 may be respectively located between the process chamber 110 and the manifold 160, and between the manifold 160 and the lid member 190 so as to provide a seal.

The nozzle unit 140 supplies, into the process chamber 110, source gases for forming thin films on the substrates W, a purge gas for purging the inside of the process chamber 110, a cleaning gas for cleaning the inside of the process chamber 110, or the like, and may be provided with dedicated nozzles for each of these gases. In some embodiments, two or more of the gases may be supplied through one nozzle.

In some embodiments, the nozzle unit 140 may include a first gas supply nozzle 142, a second gas supply nozzle 144, and a process gas supply nozzle 146. Each of the first gas supply nozzle 142 and the second gas supply nozzle 144 may be configured to supply a cleaning gas. The cleaning gas may include a cleaning gas capable of removing material films deposited on the inner surface of the first tube 112, and may include, e.g., a halogen-containing etching gas. In some embodiments, the cleaning gas may include $CF_4$, $ClF_3$, $Cl_2F_2$, $Cl_3F$, $CClF_3$, $CCl_2F_2$, $CCl_3F$, $C_2F_4$, $C_2F_6$, $C_3F_8$, etc. The process gas supply nozzle 146 may supply a gas necessary for treating the substrate W.

The nozzle unit 140 may include a material that can withstand high temperatures, e.g., quartz or silicon carbide (SiC).

A gas supply unit 132 is connected to the nozzle unit 140, and may include reservoirs for storing the source gases (or liquid source materials), the purge gas, and the cleaning gas, a vaporizer for vaporizing the liquid source materials, and a valve for controlling the supply amount of each of the gases. Although the gas supply unit 132 is illustrated as being connected to only some gas supply nozzles in FIG. 7, the gas supply unit 132 may be connected to all gas supply nozzles.

A controller 130 may control operations of the gas supply unit 132, the vertical driving unit 134, and a rotation driving unit 136. Specifically, the controller 130 may regulate the supply flow rates and supply times of the gases supplied from the gas supply unit 132 after the boat 201, on which the plurality of substrates W are loaded and/or stored, is carried into the process chamber 110 by the vertical driving unit 134. In addition, the controller 130 may regulate rotation speeds of the substrates W by using the rotation driving unit 136 in order to form thin films having uniform thicknesses on the substrates W.

The vertical driving unit 134 may include a horizontal arm 135, a vertical driving part 138 providing a driving force for moving the horizontal arm 135 in the vertical direction, and a driving shaft 139 for transmitting the driving force. The vertical driving part 138 may include a first motor. A lead screw, which is rotated by the rotational force provided from the first motor, may be used as the driving shaft 139. The horizontal arm 135 is coupled to the driving shaft 139 and may be moved in the vertical direction by the rotation of the driving shaft 139.

The boat 201 is disposed on a turntable 113, and the turntable 113 may be coupled to an upper portion of a rotation shaft 116. The rotation shaft 116 may be connected to the turntable 113 and the rotation driving unit 136. The rotation driving unit 136 may be mounted to the lower portion of the horizontal arm 135 of the vertical driving unit 134, and the lid member 190 may be disposed above the horizontal arm 135 of the vertical driving unit 134. The rotation driving unit 136 may include a second motor. The rotational force provided from the second motor may be transmitted to the rotation shaft 116. The rotation driving unit 136 may rotate the turntable 113 and the boat 201. In addition, a mechanical seal 137 for preventing leakage through a gap between the rotation shaft 116 and the lid member 190 may be located between the lid member 190 and the horizontal arm 135.

The semiconductor manufacturing apparatus 20 according to an embodiment may further include a load-lock chamber 180. The load-lock chamber 180 may include an inlet port which is disposed below the manifold 160 to carry the substrates W therein.

By way of summation and review, embodiments provide a semiconductor manufacturing apparatus that shortens the time required for a semiconductor manufacturing process. That is, a semiconductor manufacturing apparatus, according to embodiments, when components are rearranged after replacement or cleaning of the components, includes an alignment memory device that allows alignment of moved/rearranged components at same previous positions.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor manufacturing apparatus, comprising:

a first structure having a first hole;

a second structure on the first structure, the second structure including a space for accommodating a substrate and a lower plate with a second hole;

a first pin insertable into the first hole, the first pin having a same diameter as the first hole and a length smaller than a length of the first hole in a vertical direction;

a second pin insertable into the second hole and on the first pin, the second pin having a same diameter as the second hole;

a locking plate between the first pin and the second pin, the locking plate overhanging a side wall of the first pin; and a coupling member configured to couple the first pin to or separate the first pin from the second pin.

2. The semiconductor manufacturing apparatus as claimed in claim 1, further comprising a switch configured to switch the coupling member between an on-state, in which the first pin and the second pin are coupled to each other, and an off-state, in which the first pin and the second pin are separated from each other.

3. The semiconductor manufacturing apparatus as claimed in claim 2, wherein the switch is rotatable to switch the coupling member between the on-state and the off-state.

4. The semiconductor manufacturing apparatus as claimed in claim 1, wherein the coupling member includes a magnet.

5. The semiconductor manufacturing apparatus as claimed in claim 1, wherein the coupling member is on the second pin, the coupling member and the second pin being integrally coupled to each other.

6. The semiconductor manufacturing apparatus as claimed in claim 5, wherein the coupling member includes a magnet, and the first pin includes a magnetic body.

7. The semiconductor manufacturing apparatus as claimed in claim 1, wherein the first structure includes a support, and the second structure includes a boat in which a plurality of substrates are stacked and stored.

8. The semiconductor manufacturing apparatus as claimed in claim 1, wherein the locking plate is integrally coupled with the first pin.

9. The semiconductor manufacturing apparatus as claimed in claim 8, wherein the locking plate is positioned within a footprint of the second pin.

10. The semiconductor manufacturing apparatus as claimed in claim 1, wherein horizontal cross-sections of the first pin and the second pin do not have a concentric circle.

11. A semiconductor manufacturing apparatus, comprising:

a support including a first hole extending in a vertical direction;

a boat on an upper surface of the support and accommodating at least one substrate, the boat including a second hole extending in the vertical direction;

a first pin in the first hole and having a same diameter as the first hole;

a second pin on the first pin, the second pin being in the second hole and having a same diameter as the second hole;

a locking plate between the first pin and the second pin, the locking plate overlapping the upper surface of the support in the vertical direction; and a coupling member configured to couple the first pin to or separate the first pin from the second pin.

12. The semiconductor manufacturing apparatus as claimed in claim 11, wherein the coupling member includes a magnet.

13. The semiconductor manufacturing apparatus as claimed in claim 12, wherein the second pin is between the coupling member and the first pin, and the first pin includes a magnetic body.

14. The semiconductor manufacturing apparatus as claimed in claim 13, further comprising a switch with a knob, the switch being configured to adjust the coupling member to couple the first pin to or separate the first pin from the second pin.

15. The semiconductor manufacturing apparatus as claimed in claim 11, wherein the diameter of the first hole is less than the diameter of the second hole.

16. The semiconductor manufacturing apparatus as claimed in claim 11, wherein the coupling member is integrated with the second pin on an upper surface of the second pin, and the locking plate is integrated with the first pin.

17. The semiconductor manufacturing apparatus as claimed in claim 16, wherein the locking plate is within a footprint of the second pin.

18. A semiconductor manufacturing apparatus, comprising:

a support including a first hole extending in a vertical direction;

a boat which including a lower plate having a second hole extending in the vertical direction, a rod extending from the lower plate in the vertical direction and having a slot for accommodating a substrate, and an upper plate on the rod and facing the lower plate;

a first tube laterally surrounding the boat;

a gas supply nozzle extending between a side wall of the first tube and the boat, from the outside of the first tube;

a first pin in the first hole and having a same diameter as the first hole;

a second pin on the first pin, the second pin being in the second hole and having a same diameter as the second hole;

a locking plate between the first pin and the second pin, the locking plate overlapping an upper surface of the support in the vertical direction;

a coupling member on the second pin and configured to couple the first pin to or separate the first pin from the second pin, the coupling member including a magnet; and a switch including a knob, the switch being configured to adjust the coupling member to couple the first pin to or separate the first pin from the second pin, and the switch being integrated with the second pin and the coupling member.

19. The semiconductor manufacturing apparatus as claimed in claim 18, wherein a central axis of the first pin in the vertical direction and a central axis of the second pin in the vertical direction are spaced apart from each other in a horizontal direction.

20. The semiconductor manufacturing apparatus as claimed in claim 18, wherein a thickness of the locking plate in the vertical direction is in a range from about 0.8 mm to about 1.2 mm.

* * * * *